(12) United States Patent
Fiori, Jr.

(10) Patent No.: US 9,995,778 B1
(45) Date of Patent: Jun. 12, 2018

(54) SENSOR APPARATUS

(71) Applicant: David Fiori, Jr., Bensalem, PA (US)

(72) Inventor: David Fiori, Jr., Bensalem, PA (US)

( * ) Notice: Subject to any disclaimer, the term of this patent is extended or adjusted under 35 U.S.C. 154(b) by 699 days.

(21) Appl. No.: 14/497,323

(22) Filed: Sep. 26, 2014

(51) Int. Cl.
*G01R 27/26* (2006.01)
*G01D 5/20* (2006.01)
*G01D 5/24* (2006.01)

(52) U.S. Cl.
CPC ............ *G01R 27/2605* (2013.01); *G01D 5/20* (2013.01); *G01D 5/24* (2013.01); *G01R 27/2611* (2013.01)

(58) Field of Classification Search
CPC . G01D 5/20; G01D 5/202; G01D 5/24; G01R 27/2605; G01R 27/2611
USPC .......... 324/637–661, 500, 600, 76.11, 76.26, 324/444, 447, 515, 559
See application file for complete search history.

(56) References Cited

U.S. PATENT DOCUMENTS

| | | |
|---|---|---|
| 3,230,519 A | 1/1966 | Metz et al. |
| 3,851,242 A | 11/1974 | Ellis |
| 3,891,918 A | 6/1975 | Ellis |
| 4,241,317 A | 12/1980 | Breitling |
| 4,310,807 A | 1/1982 | McKee |
| 4,950,985 A | 8/1990 | Voss et al. |
| 5,652,510 A * | 7/1997 | Kyodo ................. G01D 5/2013 324/207.16 |
| 6,532,834 B1 | 3/2003 | Pinto et al. |
| 7,403,020 B2 | 7/2008 | Braun et al. |
| 7,881,409 B2 * | 2/2011 | Ghovanloo ............ H03D 3/006 375/334 |
| 8,008,909 B2 | 8/2011 | Feucht et al. |

OTHER PUBLICATIONS

U.S. Appl. No. 13/830,223, filed Mar. 14, 2013, David Fiori, Jr.

* cited by examiner

*Primary Examiner* — Melissa Koval
*Assistant Examiner* — Trung Nguyen

(57) ABSTRACT

An improved sensor apparatus for developing a signal related to an inductive sensor in a resonant circuit are disclosed. This improvement is realized by adding a known capacitance to the resonant circuit and comparing the resulting natural resonance frequency to the frequency without the known capacitance. In this way a measure of the resonant capacitance is developed to correct the sensor signal for the effect of any changes in that capacitance. One disclosed embodiment adds an electronically variable capacitance which is adjusted to yield a constant capacitance that produces a sensor signal insensitive to variations in the resonant circuit capacitance. The resonant capacitance measurement may also provide an indication of another sensor state, such as temperature or pressure, which may be used to further correct for temperature or pressure sensitivities in the sensor signal. The invention is extended by juxtaposing the inductance for capacitance in the sensor resonant circuit.

28 Claims, 10 Drawing Sheets

Fig. 4 - Preferred Embodiment

Fig. 5 - Preferred Embodiment
Oscillator

Fig. 6 - Preferred Emboidiment
Constant Current Source

Fig. 7 - Preferred Emboidiment
Low Pass Filter

Fig. 8 - Preferred Emboidiment
Capacitance Calibrator

SENSOR APPARATUS

FIELD OF THE INVENTION

The present invention relates, in general, to sensors which provide a signal related to their function by way of the variation in an electrical circuit reactance. This disclosure is particularly directed at the improvements to the electronic circuits which develop a signal responsive to the function of an inductive sensor when the sensor is combined with a capacitor to construct a resonant circuit. Non-contacting position sensors inductively coupled to moving parts are good examples of such inductive sensors. Pressure sensors with conductive diaphragms whose extension is a function of pressure which extension is measured by an inductive position or proximity sensor is another good example of an inductive sensor. The present disclosure is nevertheless directed to sensors whose function is related to variations in inductance, and whose accuracy is compromised by unwanted variations in various capacitance elements coupled to the sensor which result in errors in the measurement of sensor resonance.

This invention is equally applicable to sensors whose function is related to variations in capacitance, and whose accuracy is compromised by unwanted variations in inductive elements in the sensor resonant circuit. Such a capacitive sensor in resonance with a fixed inductor is exemplified by the capacitive pressure sensor described in U.S. Pat. No. 6,532,834 Mar. 18, 2003 to Pinto et al. entitled "CAPACITIVE PRESSURE SENSOR HAVING ENCAPSULATED RESONATING COMPONENTS".

BACKGROUND OF THE INVENTION

Sensors which respond to changes in inductive reactance are well-known. Such sensors may include one or more relatively stationary elements such as a coil of wire that constitutes an inductor characterized by inductive impedance or reactance, and a movable member which moves in the field or interacts with the stationary part in accordance with the physical position of the moving part to change the inductive reactance of the electrical connections to the sensor elements. Among these are eddy current type inductive sensors where the variation in inductive reactance and the variation in the effective series resistance of the sensor are related to the position of a moving conductive cylinder or spoiler.

Such sensors are especially useful because they are not typically subject to wear as are those sensors in which the moving and stationary parts are in contact. For example, in a simple potentiometer having a wiper blade which moves along and contacts a resistance winding, the constant moving, frictional contact between the wiper blade and the resistance winding will cause wear on the parts and so limit the useful lifetime and long term accuracy of the apparatus. Such sensors are also useful for measurements made in very high temperature environments. A coil of wire can easily be fashioned in a way so as to withstand extremely high temperatures. Moreover, such sensors are inherently very reliable on account of their simple construction involving only a single length of wire and the requirement of only two electrical connections to the sensor element.

The utility of such inductive sensors can be furthered in connection with electronic circuits that connect such sensors to a fixed capacitor to form a resonant circuit. Benefits of such a resonant circuit arrangement follow from the ability of such resonant circuit elements to store and accumulate energy in alternating electric and magnetic fields in the two reactive circuit elements of the circuit. Because of this ability to accumulate the excitation necessary to develop a useful signal level a sensor indication can be developed with lower power consumption.

Moreover, there are also advantages in designing inductive sensors that work with higher frequencies of electrical excitation. This is so because as the reactive impedance of the inductor increases in direct proportion to the frequency of operation. The advantages of operating inductive sensors at higher frequencies include lower operation power requirements, lower cost of manufacture due to fewer turns of wire required to develop the necessary inductance, and faster and more accurate position measurement response because of the higher frequency of the information signal.

Operating such sensors at higher frequencies is not without compromise however. Implementing inductive sensor circuits that operate at higher frequencies and in conjunction with a capacitor often result in sensitivity of the position function to various extraneous capacitances. These extraneous capacitances can include the capacitance in lead wires to the sensor, the equivalent capacitive couplings to the sensor element between the sensor and its surroundings, and even the reflection of the oscillator circuit gain's lag time in the input of the oscillator's gain stage.

PRIOR ART

Such Position sensors are well known in the art. For example, U.S. Pat. Nos. 3,851,242 & 3,891,918 to Ellis and U.S. Pat. No. 4,241,317 to Breitling all describe improvements to a linear inductive eddy current position sensor system based on the same sensor physics as the preferred embodiment of this invention. All of the apparatus described in these patents fundamentally develop a position function from a variation in resonant frequency in a parallel resonant circuit whereas the inductance of the sensor is connected in parallel with a fixed capacitance and which is connected to an oscillator circuit to develop a frequency of oscillation that varies with the inductance of the sensor. The period of oscillation of such circuits is related to the inductance and capacitance of the resonant circuit, for most practical purposes, as follows:

$$P_x = 2\pi\sqrt{L_X \cdot C_X} \quad [1]$$

or, equivalently $$P_x^2 = (2\pi)^2 \cdot L_X \cdot C_X \quad [2]$$

Where
$P_x$=Period of Oscillation of LC resonant circuit
$C_X$=Total Parallel Capacitance, including unknown parallel contributions, in Farads
$L_X$=Sensor Inductance, as related to sensor target position, in Henries None of these prior art disclosures teach any method to compensate for extraneous variations in the total capacitance that the sensor connections, sensor construction, or oscillator circuit effectively contribute to the total resonant capacitance. To the extent that these extraneous contributions to the resonance capacitance change due to other unrelated effects, such as the temperature of portions of the apparatus whose temperature cannot be measured, and which affect the resulting position indication, they represent errors in position indication that the current art is unable to address in a cost effective manner if at all.

U.S. Pat. No. 8,008,909 to Feucht et al. disclosed a system for the measurement of temperature of the same inductive sensor used to develop a position indication using the sensor's own inductive coil windings. That apparatus is not able to provide temperature information without interrupting the development of sensor information because it requires that the oscillator is disabled and restarted every time the temperature is measured. The apparatus measures the temperature by applying a fixed voltage to the coil windings and essentially measuring the resulting current flow. Of course connecting the sensor inductor to a fixed voltage source circuit immediately disables the oscillator which puts an immediate stop to the provision of any position measurements while the temperature of the coil windings is measured. In any event such a method requires at least a pair precision op amp and voltage regulator circuits to develop and apply a given voltage across the windings and another to convert the resulting current to a useable voltage output.

Fiori, the same inventor named herein, in his patent application Ser. No. 13/830,223 filed Mar. 14, 2013, disclosed a novel electric field shield structure for inductive position sensors which introduces significant additional capacitance to the inductive sensor resonant circuit between the shield and the inductive windings. The additional capacitance is exacerbated by the permittivity of the insulating material—usually plastic—between the inductive windings and the shield. To the extent that this capacitance is significantly temperature sensitive Fiori also disclosed a novel circuit to develop a temperature measurement that can be used to compensate for any and all temperature sensitivities related to the sensor, including that introduced by the disclosed shield structure. That disclosure revealed an apparatus that measures the temperature of the sensor based on the temperature sensitivity of DC resistance of the same inductive sensor windings used to measure the position. While that invention addressed the temperature sensitivity of the shield in addition to other temperature sensitivities inherent in the sensor physics by applying compensations based on this intimate measurement of the sensor temperature, it does nothing for any sensitivity to other environmental effects such as the mechanical deformation of the shield as a function of the pressure the sensor may be subject to. Such pressure sensitivity has been found to be an especially serious problem in applications where the sensor is immersed in hydraulic fluid under pressure. Even in applications where the sensor is immersed in an unpressurized fluid, the dielectric properties of the fluid may also vary as the result of any number of factors that would also introduce errors in the position measurement related to changes in sensor capacitance that this inventor's previous disclosures could not address.

OBJECTIVES OF THE INVENTION

The objective of this invention is to provide for the improved performance of non-contacting inductive magnetic field based position sensors in a resonant circuit when subject to extraneous capacitances that may introduce variations in the resulting oscillation frequency or period not related to the inductance variation which corresponds to the objective position function.

Another objective of this invention is to provide for a the measurement of the inductance of an inductive position sensor in a parallel resonant circuit with little, if any, sensitivity to the capacitance variation or environmental sensitivity of any capacitor used in connection with the sensor resonant circuit.

Yet another objective of this invention is to provide for the measurement of the inductance of an inductive position sensor in a parallel resonant with little, if any, sensitivity to the capacitance variation or environmental sensitivity of the equivalent capacitance of a connecting cable. In this way very long connecting cables separating the inductive sensor form the demodulating electronics are possible with little, if any, sensitivity to the temperature sensitivity of the capacitance of the connecting cables. This objective has particular utility where the sensor is used in high temperature environments where it is difficult or impossible to include the electronics in the immediate vicinity of the sensor but where more suitable conditions for the electronics are available but at some distance away from the sensor's desired location.

Another objective of this invention is to provide for the practical elimination of the effect of the connection of addition circuits which impart extraneous and unknown capacitance variations to the resonant circuit. One example of such a circuit is the DC current source circuit used to deduce the temperature of the sensor using the position sensor DC resistance of the inductive position sensor as a temperature sensor. Such a circuit is taught in this inventor's co-pending patent application Ser. No. 13/830,223 filed Mar. 14, 2013. Measurement of the sensor temperature in such an intimate way is the ultimate source of temperature compensation information. By application of the present invention here disclosed the affect of such extraneous capacitance variations due to such circuit connections are automatically corrected without practical affect on the accuracy of the position measurement or on such temperature measurement circuits.

Another objective of this invention is to provide the dual function of measuring the extraneous variations the primary sensor circuit is subject to and whose measurement is useful not only to correct for the extraneous effect on the objective measurement, but also to provide for the measurement of that extraneous, secondary, effect. For example, an inductive sensor, oscillating in a circuit subject to a variations in capacitance coupling related to the pressure of fluid surrounding the sensor, will be improved by the measurement of the variation in that capacitive coupling and removing its effect from the position measurement while at the same time using that same measurement to provide information as to the pressure of fluid surrounding the sensor.

Another objective of this invention is to provide for the compensation of variation in lumped circuit equivalent capacitance as a function of the position of the sensor target that would otherwise obscure the more accurate, predictable, and reliable relationship between the sensor target position and the inductance of the sensor.

A particularly novel objective of this invention is to measures the inductance of an inductive non-contacting position sensor in a parallel resonant circuit with essentially the same repeatability and insensitivity to environmental factors as a precision resistor.

Another particularly novel objective of this invention is to provide for the measurement of various environmental variations such as temperature or pressure, or even humidity by employing capacitors which are sensitive to such variations to implement the invention and so additionally provide for an indication of such variations and the opportunity to further correct the accuracy of the sensor with respect to any sensitivity to such variations.

Yet another particularly novel objective of this invention is to provide a measure of the position as the square root of the inductance of an inductive non-contacting position sensor in a parallel resonant circuit using a simple analog circuit to approximate the calculations necessary to compensate for variation in lumped circuit equivalent capacitances and so provide for a an improved and low cost inductance sensor with infinite output resolution.

Last, but not least, it is an objective of this invention to achieve all of the above objectives without any interruption in the provision of sensor measurements and without any delays in disconnecting and reconnecting or restarting the oscillator.

SUMMARY OF THE INVENTION

An additional reference capacitor of known value is alternately switched in and out of a parallel connection with a resonant capacitor in resonance with the sensor inductance. In this way the oscillator oscillates continuously to provide sensor information as it is always operating in connection with a complete resonant circuit. Such a circuit is illustrated in FIG. 2 where switch 12 is used to connect reference capacitor 11 into the parallel resonant circuit comprised of sensor inductor 2 and total equivalent resonant capacitance 10. The period of oscillation before the reference capacitor is switched onto the sensor resonant circuit and the period of the oscillation after the additional capacitor is switched onto the sensor resonant circuit is measured and processed according to the following relationships:
Where
$P_1$=Period of Oscillation without reference capacitor
$P_2$=Period of Oscillation with reference capacitor
$C_R$=Value of switched reference capacitor
$C_X$=Value of unknown parallel capacitance before switched reference is added
$L_X$=Sensor Inductance, as related to sensor target position, in Henries
Then $$P_1^2 = (2\pi)^2 \cdot L_x \cdot C_x \qquad [3]$$

$$P_2^2 = (2\pi)^2 \cdot L_x \cdot (C_x + C_R) \qquad [4]$$

Solving for Cx $$C_x = \frac{C_R \cdot P_1^2}{P_2^2 - P_1^2} \qquad [5]$$

and using the results for Cx to solve for the inductance, $L_x$, in eq. [3] which is sensor parameter of interest:

$$L_x = \frac{1}{(2\pi)^2} \cdot \frac{P_2^2 - P_1^2}{C_R} \qquad [6]$$

Equation [6] therefore shows how to process the periods measured according to this invention to yield a measurement of inductance and therefore yield an indication of the sensed parameter in a way that is theoretically not directly dependent nor practically sensitive to the unknown total parallel capacitance in the resonant circuit of the inductive sensor. Instead, the inductance measurement is essentially related only to the known reference capacitance, $C_R$. Such period measurements are easily and cost effectively carried out with counter circuits configured to measure time periods which circuits are commonly included in modern micro-processors. For a given inductance it may be observed that the difference between the measured periods is substantially independent of any variable factor and that the difference by itself may be regarded as the square of a corrected period measurement of the same genesis as the measured periods:

Where
$P_0$=Period after Correction for variation in resonant capacitance
$C_0$=Equivalent Resonant Capacitance after correction
$C_R$=Value of switched reference capacitor $$P_0^2 = (2\pi)^2 \cdot L_x \cdot C_0 \qquad [7]$$

$$P_0^2 = \frac{C_0}{C_R} \cdot (P_2^2 - P_1^2) \qquad [8]$$

Then, if $C_0 = C_R$, which provides the best resolution in the result:

$$P_0^2 = P_2^2 - P_1^2 \qquad [9]$$

Various functions of the inductance measured, and approximations of these functions may be applied for a multitude of purposes in connection with inductive sensors. Chief among these is the square root of the inductance which is advantageous in connection with linear position sensors comprised of an inductive coil with high length to diameter ratios. This function is expressed in Eq. 9.

$$P_0 = \sqrt{P_2^2 - P_1^2} \qquad [10]$$

And if $C_0$ is substantially larger than the expected variation in capacitance, then [9] may be approximated as:

$$P_0 = (\sqrt{2} \cdot P_2) - P_1 \qquad [11]$$

This is a very simple calculation which can be carried out entirely in a simple linear analog computer circuit where analog voltages can be developed from the two periods with an analog pulse width to analog converter and applied to a differential amplifier designed for a square root of 2 weighting on the positive input of the differential amplifier. This analog technique is especially useful where an analog signal with an infinite resolution is desired in the provision of a linear position signal according to this invention. This can be accomplished by the FIG. 9 circuit with resistor value selections as follows:

The result in equation [11] can also be accomplished with an ordinary differential amplifier but requires at least one additional amplifier circuit. The additional amplifiers would be configured so that the positive input would have $\sqrt{2}$ times more gain than the gain applied to the signal on the negative input.

The more precise equation [10] can also be calculated using analog circuit integrated circuits such as the Analog Devices AD534, but at a greatly increased cost. Two of the AD534s could be employed to develop the squares of the period-related signals and a third AD534 could be employed to calculate the square root. Other analog computer solutions would be obvious to those skilled in the art who desire an analog output with infinite resolution.

In the apparatus where a digital signal processor such as a microprocessor is employed and the two time periods are measured digitally, calculations may then be carried out with a micro-processor program such as described in equation [10].

The circuit necessary to determine the two periods or frequencies necessary to carry out the aforementioned measurements is shown in FIG. 2. The first period or frequency of oscillation is developed when switch 12 is off and is determined by the resonance of the unknown total equivalent parallel capacitance that acts in parallel with the sensor inductor 2 illustrated as capacitor 10, while the second period or frequency of oscillation is developed when switch 12 is turned on to add the reference capacitor 11 in parallel with the equivalent parallel capacitance 10 to resonate with sensor inductance 2.

A second switch and a second reference capacitor of an intermediate value may be employed to further improve the performance of a sensor apparatus equipped with this invention as illustrated in FIG. 3. Reference capacitor 11 and capacitor 15 may be switched alternatively and together by the appropriate coordination of switches 12 and 16 to apply up to three additional values of parallel capacitance to the resonance circuit. By measuring up to four different periods or frequency corresponding to all the possible parallel capacitance configurations and with an appropriate analysis of the results, a more accurate estimate of the unknown parallel capacitor may be developed. More accurate estimates can be accomplished by explaining any departure from the expected periods as secondary effects that can be estimated and used to provide corrections to all the period or frequency readings errors due to such secondary effects to determine more accurate values for the unknown resonant capacitance in addition to the position indicating sensor inductance. Additional sets of reference capacitors and switches may be employed to provide additional information in the way of period or frequency measurements to more accurately estimate such secondary effects and thereby further improve such corrections.

This improvement, like that disclosed by the present inventor in his patent application Ser. No. 13/830,223 filed Mar. 15, 2013, may also be improved by the employment of a zero phase oscillator. However, the reference capacitor will change the resonant frequency and hence the oscillation frequency enough which will result in deviations from zero phase in the oscillator. It will also yield substantial deviations in the drive level necessary to maintain acceptable oscillation levels. To correct this, this invention may be further improved by use of an analog switching circuits to switch the compensating phase lag of the oscillator so as to realize substantially a zero phase mode of oscillator operation when the reference capacitor shifts the resonant frequency of the oscillation circuit. The invention may also be improved to change the magnitude of driving currents when the reference capacitor shifts the gain required to sustain oscillation. This may be done by switching a different resistor value into that part of the oscillator circuit that determines the magnitude of the oscillation drive current delivered to the resonant circuit.

In addition, temperature measurement circuits, especially circuits that are able to use the DC resistance of the sensor coils to accurately determine the temperature of the sensor coils and the nearby target material to compensate for temperature sensitivities in these parts of the sensor as taught by the present inventor in his patent application Ser. No. 13/830,223 filed Mar. 14, 2013, may also be employed to further improve the position measurements of such an apparatus. For lower power applications a high resistance temperature sensor element, placed in or placed in the immediate vicinity of the sensor coil may be wired in series with the inductive sensor coils and suitably bypassed with a parallel capacitor to substantially remove its effect from the resonant circuit.

It should be noted that the reference capacitor or capacitors used in connection with this invention are not connected to the sensor at all times. As such, the capacitance of the reference capacitor or capacitors may be measured with compatible timing circuits that measure the time necessary to charge the capacitor by way of a reference resistor during those periods of time when the reference capacitor is not engaged. In this way the value of the reference capacitor may be accurately determined to at least the level of accuracy of the resistor and the associated time measurement circuits which are typically substantially less subject to variation in environmental effects such as temperature and humidity than practical capacitors are. Such measurement circuits compatible with the invention here described are well know to those skilled in the art of digital capacitance measurement circuits which are commonly used in a large variety of applications. A circuit such as that incorporated in U.S. Pat. No. 7,403,020 to Braun et al. entitled "METHOD AND DEVICE FOR MEASURING CAPACITANCES" may be readily adapted to the measurement of just the one capacitor required in this invention by any person with ordinary skill in this art. It is worth noting that such a circuit applied to a single capacitor according to the requirements of this invention certainly would not infringe that patent as the circuit applied to measure one capacitor was unclaimed in that patent not to mention that the circuit applied to one capacitor has been well known to those of ordinary skill in the art for many years.

The introduction of an electronically variable capacitance whose capacitance is applied in parallel to the sensor resonant circuit in such a way to yield a constant total capacitance regardless of the variations in equivalent capacitance due to undesirable extraneous affects on the sensor and the sensor demodulation circuits is a particularly novel adaptation of this invention. This variation on the present invention can be simply implemented by varying such an electronically variable capacitance to yield a zero result to a weighted difference between the period measured with and without the connection of the reference capacitor. Once the total resonant capacitance is adjusted that way, the sensor inductance will be simply proportional to the square of either measured period. Moreover, the desirable square root metric of the inductance for long stroke position sensors is therefore simply proportional to the measured period in either switch position.

This circuit to implement this variation of the invention is shown in FIG. 10. Variable capacitor 89 is electronically controlled by signal 90 from logic and control 13. The variable capacitor may be implemented with a varactor diode or with an electronically variable gain element configured to vary the miller capacitance of a capacitor connected to the parallel resonant circuit and the output of the variable gain element. The two periods may be measured with analog circuits or with digital counters. The control of the variable capacitance as a function of the weighted sum of the two measured periods or from the ratio of the two periods may be understood to follow from the following equations:

$$C_0 = C_x + C_{adj} \quad [12]$$

Where
$C_0$=Target Capacitance after Correction for variation in resonant capacitance
$C_x$=Equivalent Resonant Capacitance before addition of the variable capacitor
$C_{adj}$=Value of electronically variable capacitor added to the resonant circuit
$C_R$=Value of switched Reference capacitor Applying [11] to the equations that describe the natural frequency of the sensor resonant circuit with and without the reference capacitor are given in equation [12] and [13]:

$$P_1^2 = (2\pi)^2 \cdot L_x \cdot C_0 \quad [13]$$

$$P_2^2 = (2\pi)^2 \cdot L_x \cdot (C_0 + C_R) \quad [14]$$

$$\frac{P_2^2}{P_1^2} = \frac{C_0 + C_R}{C_0} = 1 + \frac{C_R}{C_0} \quad [15]$$

$$\frac{P_2}{P_1} = \sqrt{1 + \frac{C_R}{C_0}}. \quad [16]$$

Hence $C_0$ could be maintained by controlling the added capacitance such that the ratio of the two measured periods is held constant. Multiplying Eq. [16] by $P_1$ and rearranging of terms suggests a capacitance control target criteria that is much easier to implement:

$$0 = P_2 - P_1 \cdot \sqrt{1 + \frac{C_R}{C_0}}. \quad [17]$$

In the special case where $C_R = C_0$ which maximizes the control resolution:

$$0 = P_2 - P_1 \sqrt{2}. \quad [18]$$

This shows that the control null target for controlling $C_0$ may be simply the weighted difference of the two measured periods. The servo amplifier for controlling $C_0$ is therefore simply implemented by a differential amplifier with input weighting with a circuit exactly like that illustrated in FIG. 9 excepting that the period measurement circuit outputs are juxtaposed so that the weighting that is shown for $P_1$ is applied to $P_2$ and vice versa.

With the above control carried out with analog circuits, the resulting natural frequencies of the inductor resonant circuit with and without the reference capacitor will both be simply proportional to the desirable square root of the sensor inductance and that measure will approach an exact compensation of the variations in parallel resonance circuit total capacitance and so provide a high degree of extraneous capacitance compensation while delivering output periods with infinite resolution and while constantly delivery output periods indicative of position without interruption or the need to disconnect, reconnect and restart the oscillator.

However this invention is carried out, whether using digital or analog circuit techniques to arrive at a sensor signal, there may be useful information in the measurement of the equivalent parallel capacitance of the sensor resonant circuit. For example, when the equivalent capacitance of a sensor varies in proportion to the pressure acting on the sensor, the sensor demodulators described herein could then provide an electronic signal related to the measured capacitance and therefore to the pressure acting on the sensor. Compensation of the sensor for any sensitivity to such environmental variations are then possible. The sensor could be engineered to have capacitance variation that is sensitive to pressure, temperature, or even humidity and the measurement of the capacitance and therefore the related environmental variation would be useful in compensating the signal for any sensitivity the sensor may be subject to with respect to such environmental variations. In the digital implementation of this invention the calculation to determine the capacitance can be done from the same digital resonant circuit measurements but utilizing the micro-processor to implement the calculations substantially as described in equation [4] with no significant increase in cost. Moreover, the control signal used to specify the capacitance added by the analog demodulator, incorporating an electronically variable capacitor circuit, would therefore provide a signal indicative of the sensor resonant capacitance and therefore pressure in such an instance. Alternatively, an analog computer circuit, using readily available commercial integrated circuits such as the Analog Devices AD534 could be used to carry out equation [4] from pulse width to analog conversion circuits as would be obvious to any one of ordinary skill in the art.

For example, in sensors where there is a large sensitivity of equivalent sensor capacitance to pressure, as may be the case in systems where the sensor is surrounded by an electric field shield such as was disclosed in his patent application Ser. No. 13/830,223 filed Mar. 14, 2013, and which separation between the sensor windings and the shield may vary according to the pressure acting on the sensor, the demodulation of the resonant circuit capacitance would be indicative of the surrounding pressure. This measurement would then afford the opportunity of further correcting the sensor signal for any sensitivity to ambient pressure.

A sensor and the resonant circuit parts may also be constructed in a way that results in a known temperature sensitivity of the equivalent resonant circuit capacitance, and so the measurement of the capacitance could therefore be engineered to indicate the temperature of the electronics circuit or the sensor or even an optimal mixture of both, depending on the proximity of the temperature sensitive components. Consequently, the capacitance indication could be used to provide for the correction of the temperature sensitivities of specific parts of the sensor apparatus, depending on the proximity of the temperature sensitive capacitors to those parts.

It should be noted that this invention may be applied with the same utility to the measurement of the capacitance of a capacitive sensor in a resonant circuit with an inductor of uncertain value, where a known inductance is switched onto the resonant circuit. All references to any reactance contributing to the sensor resonant circuit in this disclosure may therefore be juxtaposed with its complementary reactance to describe the invention in application to a capacitive sensor whose reactance is complementary to an inductive sensor. Specifically, all references to capacitors in connection with the sensor resonance circuit herein may be replaced with its complementary inductance reactance, and vice versa, to render a sensor apparatus for capacitive sensors instead of inductive sensors to which this invention may be applied.

DESCRIPTION OF THE DRAWINGS

FIG. 1A also shows a coaxial cable, 3, connecting the sensor to the oscillator whose equivalent capacitance is represented as capacitor 8 in FIG. 1B. Last, but not least, capacitor 4 represents the input capacitance of the oscillator which includes an equivalent input capacitance corresponding to intrinsic circuit input capacitance in addition to the reflection of oscillator amplifier poles in the oscillator's feedback network that result in an additional effective capacitance component in the sensor resonant circuit.

FIG. 2 illustrates an inductive sensor 2, in a parallel resonance circuit with capacitor 10 having an unknown variation due to the various extraneous effects as represented in FIG. 1, connected to an oscillator circuit 5 providing an output at 6 which is a periodic signal having a period or frequency related substantially to that of the resonant period or frequency of the sensor's parallel resonant circuit. FIG. 2 illustrates a reference capacitor 11 which is electronically connected or disconnected by electronic switching element 12 according to the direction of a logic & control circuit 13. This circuit therefore is able to provide the two different period oscillations to the demodulation circuit according to the dictates of the logic and control circuit part of 13 and is therefore able to provide an output at 14 according to the demodulation part of circuit 13. The demodulation part of circuit 13 would be configured to implement the calculations described in equation [5] based on the measurements of the two periods the circuit develops by operation of switch 12. The demodulation part of circuit 13 would then use that result to form an electronic signal at output 14.

FIG. 4 is the top level in a hierarchical representation of the preferred embodiment of this invention. It shows the different circuit parts, in particular the equivalent and unknown equivalent total parallel resonant capacitance 10, in addition to switch 12 that adds reference capacitance 11 to the resonant circuit. Current source 19 delivers DC current 20 used to measure the DC resistance of the sensor inductor 2 in connection to low pass filter 22 and amplifier 23 as described in the present inventor's patent application Ser. No. 13/830,223 filed Mar. 14, 2013.

FIG. 5 illustrates the preferred embodiment of oscillator 5. In particular this oscillator circuit includes switches for configuring the oscillator to operate optimally for each mode of frequency developed from switching reference capacitor 12. Switch 31 alters the input phase compensation to maintain the zero phase oscillation condition disclosed in this inventor's patent application Ser. No. 13/830,223 filed Mar. 14, 2013. In addition, switch 45 increase the drive level the oscillator applies to the sensor's resonant circuit to make up for the reduced impedance of the resonant tank cause by the increase in resonant capacitance when reference capacitor 11 is switched into the resonant circuit and so maintains the same optimum operating level in the oscillator circuit when the resonant circuit is operated with different capacitance values.

FIG. 6 shows a circuit that accurately provides constant current 17 to the resonance inductor while minimizing the effect of the circuit on the behavior of the resonant circuit which is important to the objective of this sensor apparatus.

FIG. 7 details a practical low pass filter to reduce the high frequency content of the sensor temperature signal to permit low frequency amplifier 23 to operate properly and accurately.

THE PREFERRED EMBODIMENT

Figure 1A:
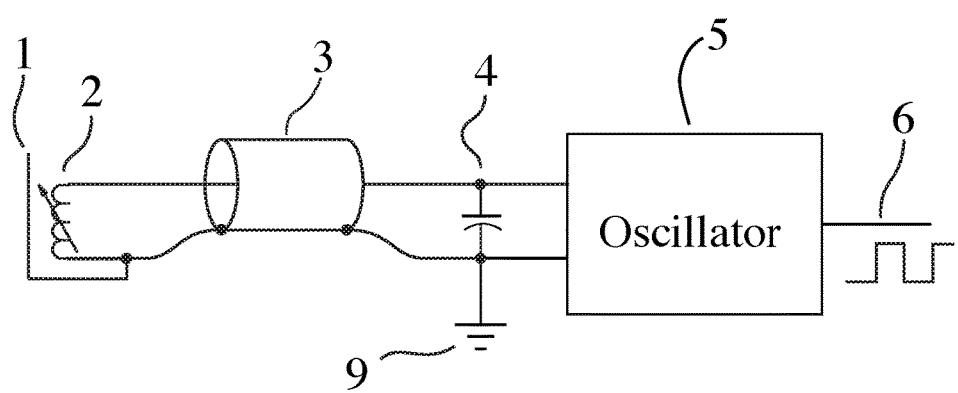
FIG. 1A shows a sensor inductor 2 in proximity to sensor shield 1 whose equivalent effect on the sensor resonant circuit is represented as capacitor 7 in FIG. 1B.
Figure 1B:
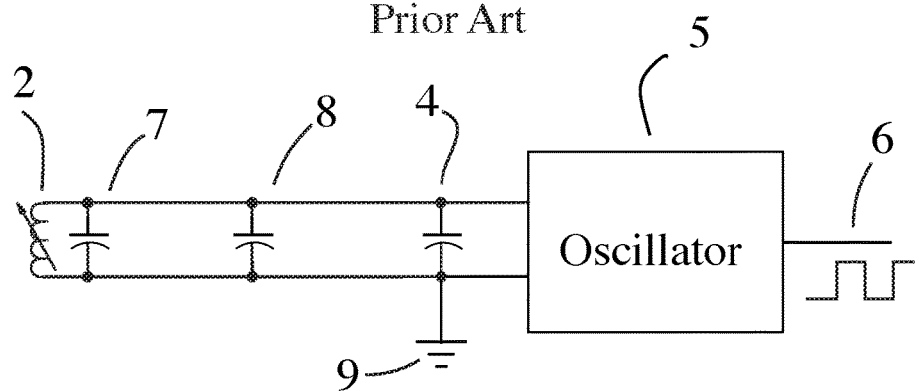
FIG. 1 is an illustration of the various contributions to the capacitance in a practical inductive sensor transducer circuit configured to operate in a resonant mode circuit. These figures illustrate that the total capacitance that resonates with inductor 2 is composed of a sum of different capacitances whose exact total value is unknown and subject to environmental influences such as temperature, pressure, humidity. Unknown contributions to the resonant circuit capacitance include the effective capacitance of the sensor shield, the capacitance between conductors in the wiring between the sensor and the oscillator, and the equivalent input capacitance of the oscillator circuit.
Figure 2:
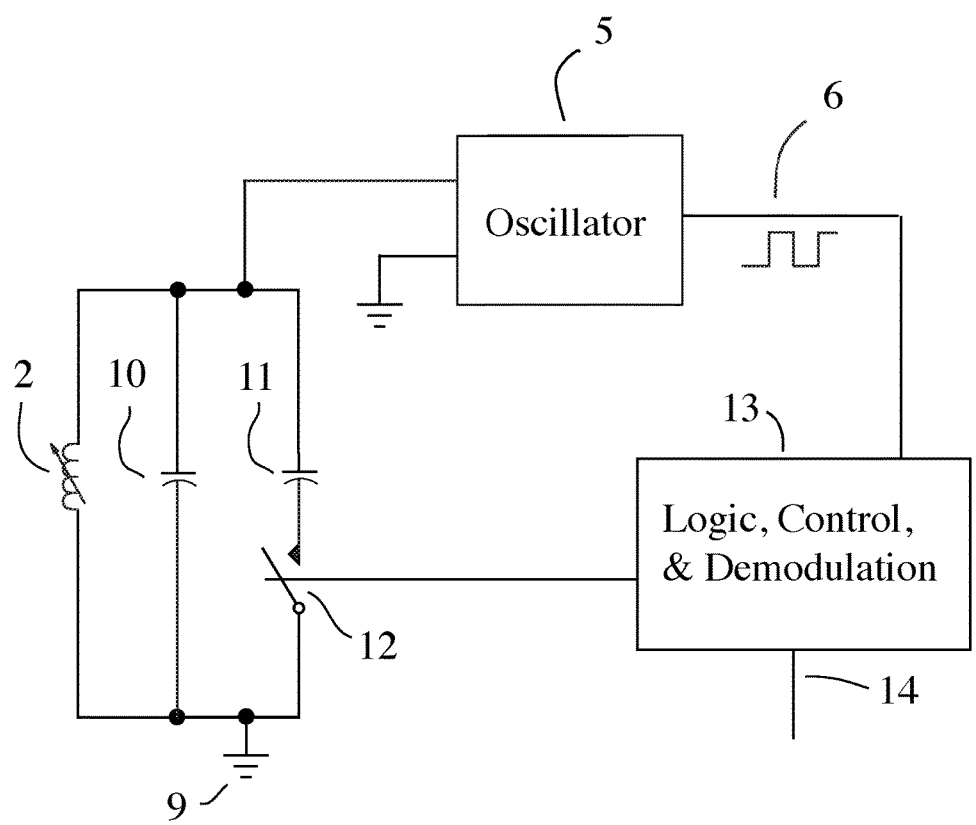
FIG. 2. Is an illustration of the most basic implementation of this invention.
Figure 3:
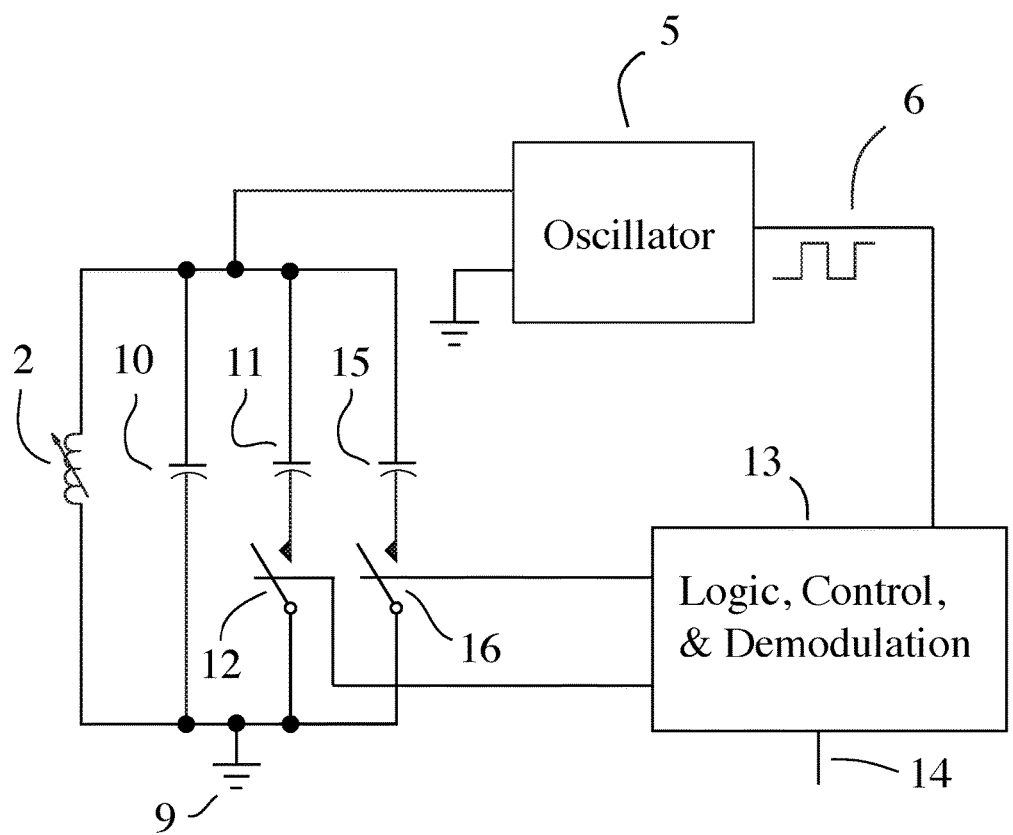
FIG. 3. Illustrates a form of this invention with a second reference capacitor 15 switched onto the resonant circuit with a second switch 16. By the appropriate coordination of the switch states logic and control part of circuit 13 is able then to apply up to three different values of known capacitance to the resonant circuit and so provide four different measurements. These measurements may then be used by the demodulation part of circuit 13 to provide more accurate corrections of circuit error sources and provide even further improvement to the precision of the measurement of the sensor inductance.

The preferred embodiment of this invention implements a system which measures the inductance of an inductive non-contacting position sensor in a parallel resonant circuit with essentially the same repeatability and insensitivity to environmental factors as a precision resistor. Simultaneously, the preferred embodiment of this invention also measures the temperature of the inductor in the most intimate and therefore most accurate way possible—by using the position sensor itself as a temperature sensor—in order to correct the precision measurement whose position function is naturally subject to significant temperature sensitivity which sensitivity is itself a strong function of the position. As the only variable the system is subject to after application of the capacitance compensating circuit disclosed herein is essentially the sensor inductance, and understanding that the only other variable significantly affecting the relationship between sensor inductance and position is temperature, the relationship between position, temperature and inductance can be determined with great accuracy. The result is a low cost, lightweight, and reliable sensor that is insensitive enough to every possible environmental variable to satisfy many demanding non-contacting sensor applications.

This is done by utilizing the present invention to compensate for any capacitance variations that appear in the sensor resonant circuit and to render a measure of the sensor inductor as a function only of that reference capacitor whose value can be accurately measured in relation to the value of a precision resistor.

The preferred embodiment of this invention employs a modified Colpitts oscillator 5, which first develops oscillation periods indicative of the sensor inductance 2 with the resonant capacitance 10. The resonant capacitor 10 includes the input capacitance of the oscillator 5, specifically capacitors 10a in series with capacitor 10b, along with other extraneous capacitances with unknown sensitivities to effects such as temperature or sensor position. Among the extraneous capacitances is the capacitance between the terminals of electronic switch 12 while it is off. After the first period is measured by the demodulation circuit 13, the logic and control circuit of 13 then causes switch 12 and 70 to close to connect the reference capacitor 11 in parallel with the total resonant circuit capacitance 10. This results in the capacitance of reference capacitor 11 adding to the overall resonant circuit capacitance. The logic and control circuit also turns switch 17 off so that the capacitance between the terminals of electronic switch 17 add to resonant circuit capacitance at the same time switch 12 is closed removing its capacitance from the parallel resonant circuit. When the capacitance of the off state of switch 17 and switch 12 match, such as would be the case when both switches are part of the same monolithic semiconductor substrate as is the case with most SPDT analog switches, such as the Analog Device's ADG839 specified for the preferred embodiment of this invention, the off state capacitance of each switch will add to the resonant circuit resonance at alternate times so the off state capacitance effect of the switch circuit will be constantly present and therefore subject to the compensation action of the present invention and so render the position measurement without sensitivity to changes in the off state capacitance of the switch or switches used, such as those shown at 12 and 17 of the preferred embodiment.

The preferred embodiment oscillator 5 develops an oscillation at the natural resonant frequency of the sensor's resonant circuit. The oscillator circuit preferred in this embodiment is well known in the art as a Colpitts oscillator, but is modified for the preferred embodiment of this invention to provide a zero phase shift from input to output of the emitter follower gain stage at transistor 34 for frequencies of oscillation in the vicinity of the natural resonant frequency of the sensor's resonant circuit. The theory is that the oscillator with a non-zero phase shift gain stage will oscillate at a frequency different from the resonant circuits natural resonant frequency to accommodate the phase shift the gain stage introduces according to the phase versus frequency properties of the sensor resonant circuit. The relation between the phase shift of the oscillator gain element and the frequency developed in connection with the sensor's resonant circuit is therefore a strong function of the losses in the resonant circuit, which in turn are temperature sensitive. This means that smaller phase shifts in the oscillator gain stage will result in reduced temperature sensitivity to the temperature dependent losses in the resonant circuit. This theory explains that a zero phase shift oscillator gain loop should result in the smallest possible temperature sensitivity for a resonant circuit oscillator.

However, the merits of a zero phase shift oscillator design are lost when the frequency of oscillation is shifted by the addition of a reference capacitor into the sensor's resonant circuit. This is a consequence of the fact that practical phase shift compensation networks that realize the ideal zero phase shift gain condition provide the proper compensation only at a certain frequency of operation. This means that, because of the shift in the natural resonance frequency of the resonant circuit due the additional reference capacitance in the resonant circuit, the phase compensation network designed for the natural frequency of the sensor's resonant circuit without the reference capacitor will not realize a zero phase gain stage when the reference capacitor is added to the capacitance in the sensor's resonant circuit. To overcome this problem the preferred embodiment utilizes an electronic switch to coordinate the alteration of the phase compensation network with the connection of the reference capacitor so that a zero phase gain is realized regardless of the shift in the natural resonant frequency of the sensor resonant circuit caused by the connection of the reference capacitor.

Figure 5:
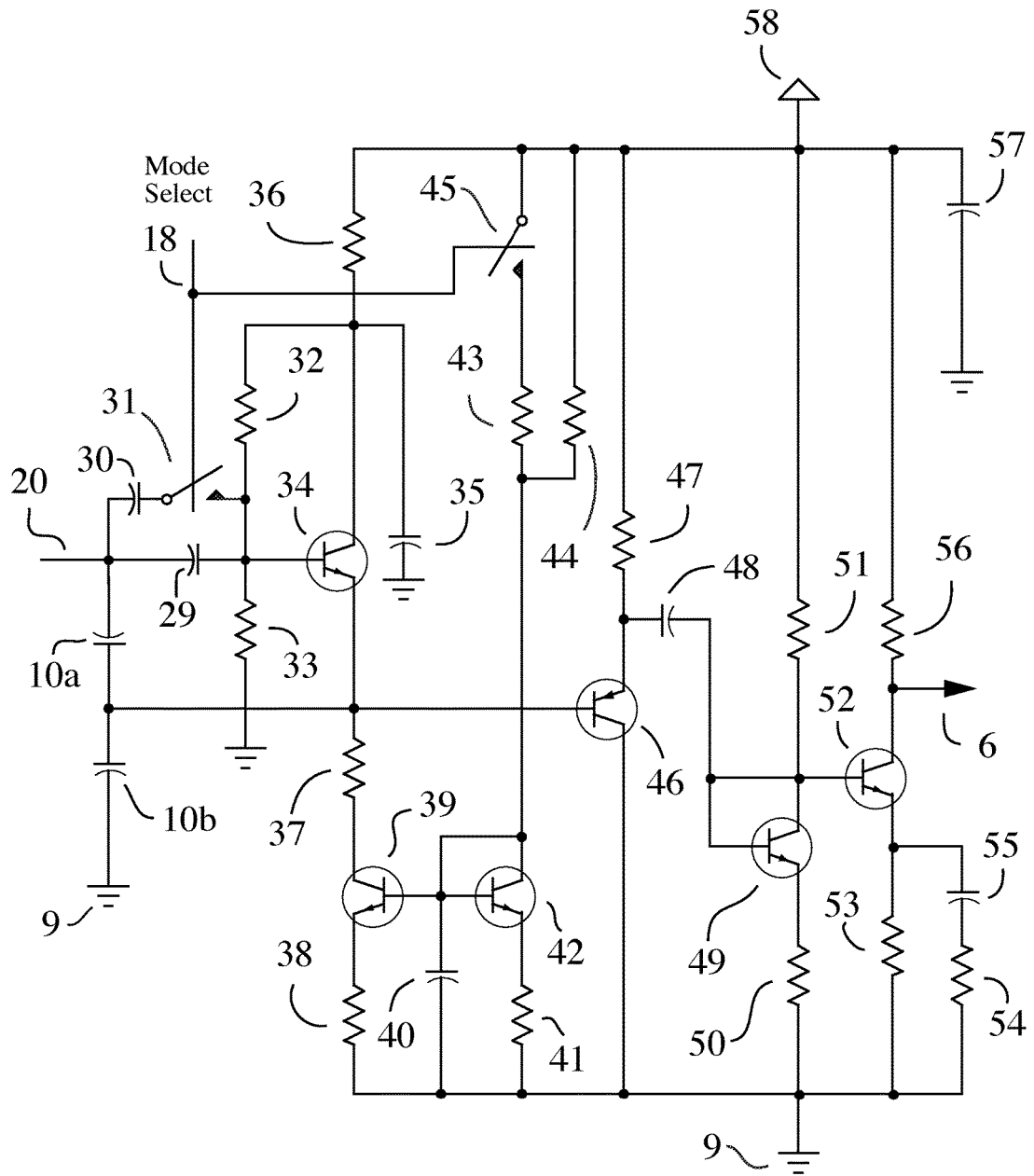

In the oscillator circuit used in the preferred embodiment, the equivalent input impedance of the amplifier is substantially the parallel combination of the DC bias resistors 32 and 33, which, fed by the coupling capacitor 30 forms a single zero filter that develops the phase lead necessary to compensate for the phase lag of the buffer gain provided by transistor 34. To maintain a zero phase gain of operation, switch 31 in FIG. 5 appropriately shifts this oscillator phase compensation network by adding additional capacitance 30 to capacitor 29 in the lead compensation network.

The oscillator circuit gain is provided by transistor 34 in connection with the low capacitance constant current source pull down circuit consisting of transistor 39 whose current is regulated by the action of a transistor 42, resistors 38 and 41 to form a current amplifier or mirror. This circuit amplifies or mirrors the current delivered to transistor 42 and sinks a corresponding current through resistor 37 to function as a constant current pull down bias current for transistor 34. Capacitor 40 shunts any AC gain in the circuit of transistor 39 to avoid the Miller effect multiplication of collector to base capacitance in connection with transistor 39 caused by the amplification of AC current from the collector to base capacitance by the current gain of transistor 39. This circuit therefore provides high AC impedance while delivering the current necessary to operate transistor 34 and drive the resonant circuit at the juncture of capacitor 10a and 10b with the desired level of excitation.

In addition to shifting the natural resonant frequency of the oscillator, adding the reference capacitor to the sensor's resonant circuit according to this invention also decreases the impedance of the resonant circuit which will therefore require a higher drive level to achieve the same amplitude of oscillation. To provide the same amplitude of oscillation before and after the reference capacitor 11 is added in parallel to the sensor's resonant circuit, the oscillator drive current is increased by arranging the circuit to impress a larger current into the input of the current mirror or current amplifier at the same time the reference capacitor is added to the resonant circuit. This is done in the preferred embodiment by switching resistor 43 in parallel with the resistor 44 that determines the current that flows into the current mirror or current amplifier transistor 42 and which then produces a corresponding drive current for oscillator amplifier transistor 34 via transistor 39 and through resistor 37.

Figure 8:
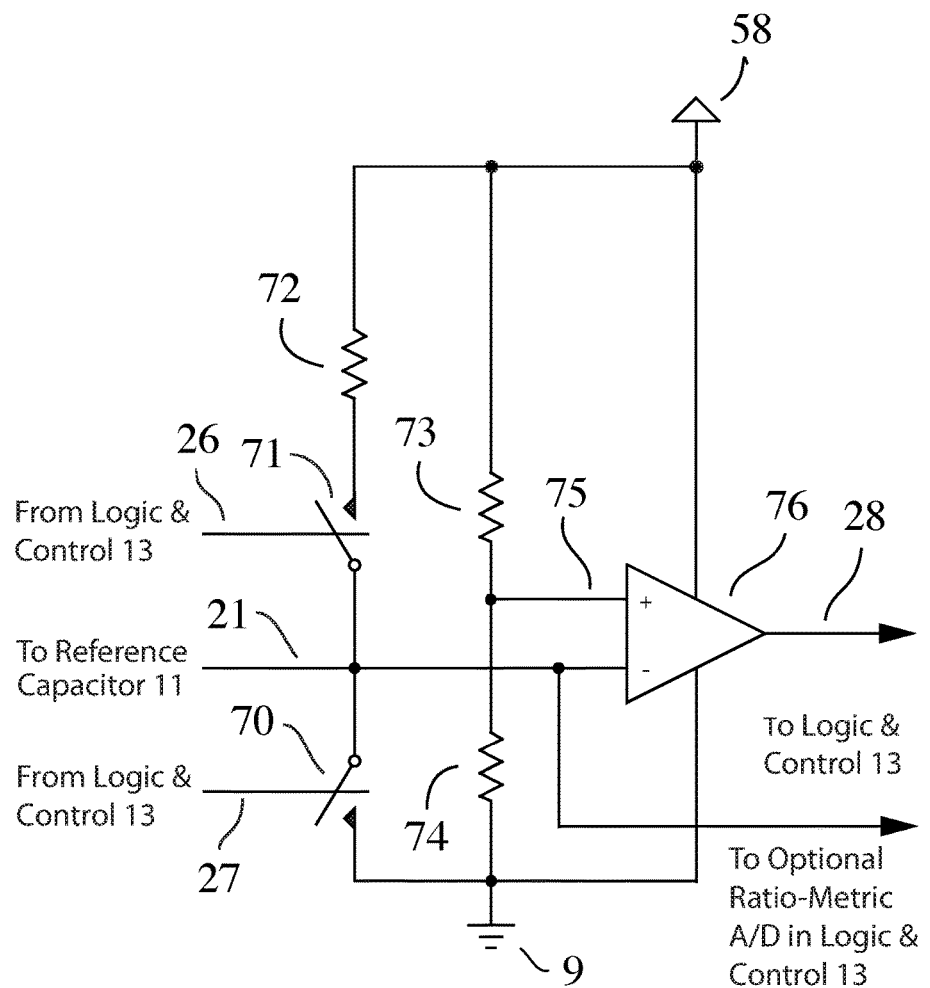
FIG. 8 details the additional circuitry required to measure the reference capacitor to account for the variation in the value of the capacitor used as the reference capacitor 11. Switch 70 is used both for connecting one end of the reference capacitor 11 when it is adding capacitance to the sensor's resonant circuit, and for resetting the reference capacitor to a zero starting voltage when it is available for measurement calibration. A resistor of known or stable value, resistor 72, is connected by switch 71 to the reference capacitor 11 when capacitor 11 is not being applied to the sensor's resonant circuit. Comparator 76 develops a digital signal relating to the time at which the capacitor voltage reaches the threshold set at node 75 by resistor divider network resistors 73 and 74, which, once measured, can be used to calculate the value of the capacitor as a function of the value of the charging resistor 72.
Figure 9:
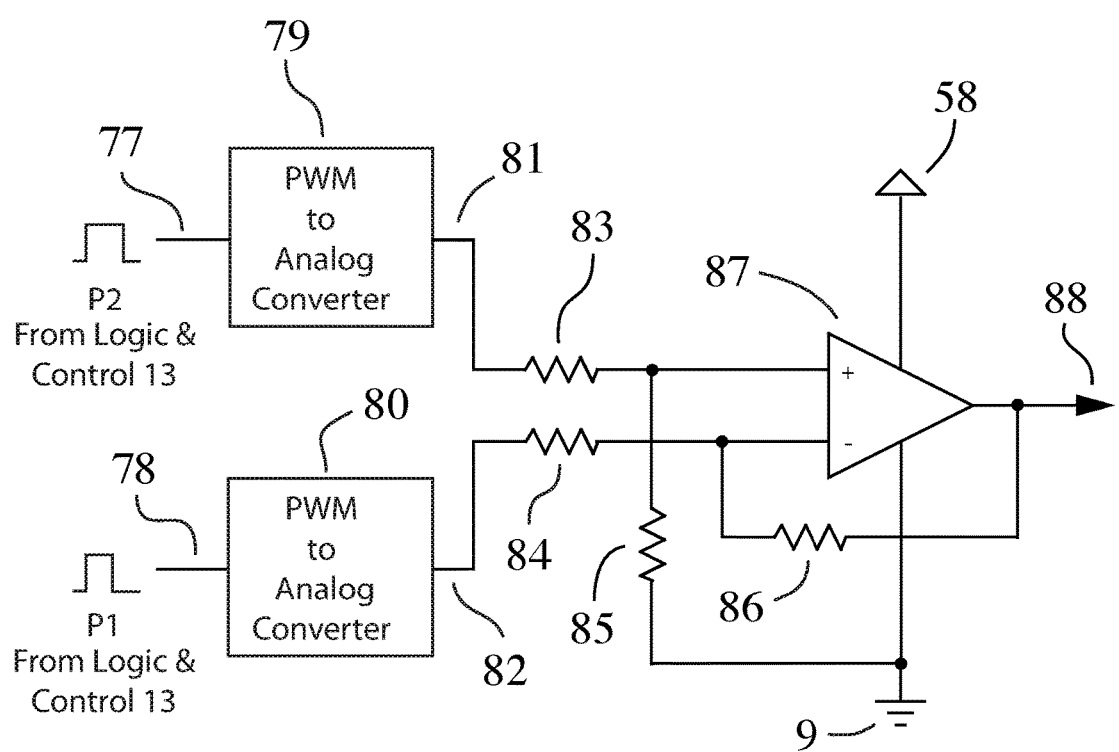
FIG. 9 diagrams a low cost circuit for providing the calculations required by this invention whereas the signal is maintained entirely in analog form. This provides for a substantial degree of compensation for extraneous capacitance variations in the sensor resonant circuit while providing an output analog voltage with infinite resolution.
Figure 10:
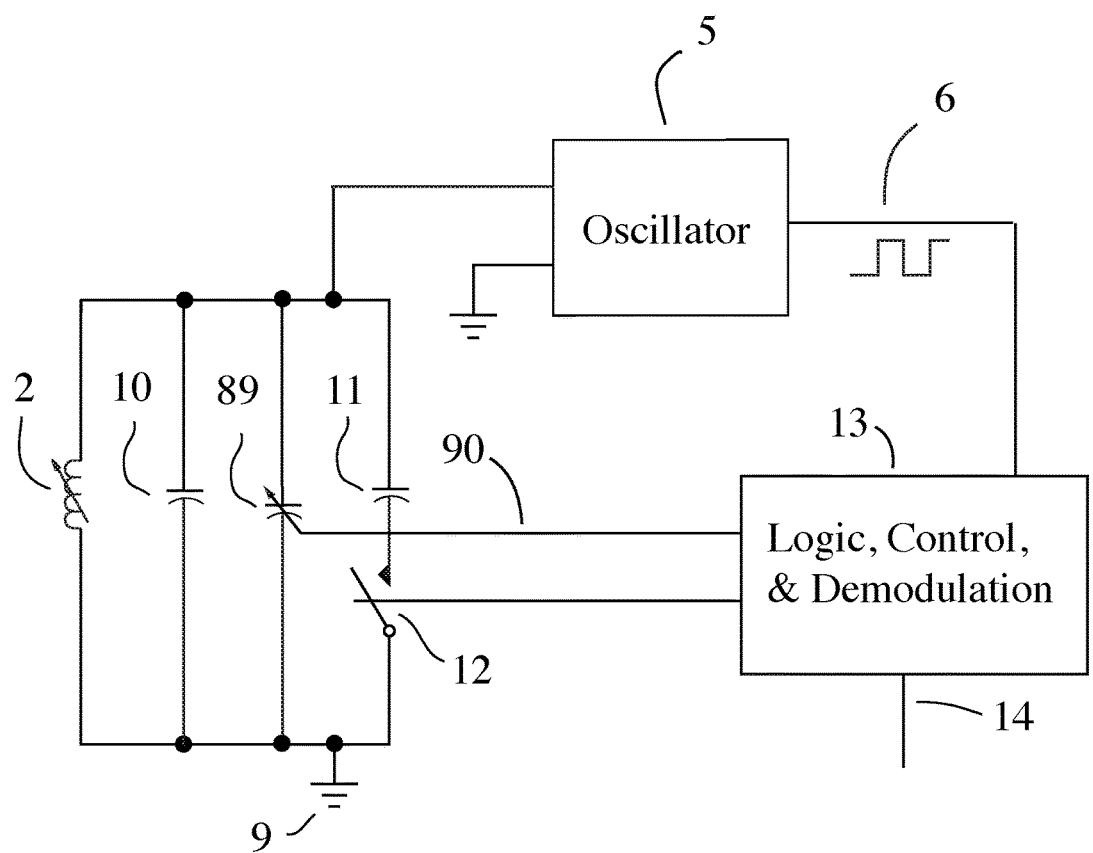
FIG. 10 diagrams the system utilizing an electronically variable capacitance to result in sensor period signals which are directly proportional to the desirable square root of the variation in sensor inductance and which periods are insensitive to any variation in extraneous resonant circuit capacitance.

When, according to this invention, the logic, control, & demodulation circuit 13 disconnects the reference capacitor 11 from the sensor resonant circuit by opening switch 12. Reference capacitor 11 is no longer connected to the sensor resonant circuit and its value may then be independently measured. Upon closing switch 17 one end reference capacitor 11 is connected to reference potential 9 and the RC timer circuit is then engaged to measure the value of the reference capacitor 11 in what is termed the capacitance calibrator 25. Capacitance calibrator 25 is shown in detail in FIG. 8. When the reference capacitor 11 is first disconnected from the sensor's resonant circuit and switch 17 is closed, reference capacitor will first be reset by the closure of switch 17 as determined by the microprocessor logic and control circuit 13. Once enough time is allowed for all of the charge difference on capacitor 11 to equalized by the conduction through switches 17 and 70, and the potential difference between its terminals is zeroed, switch 70 is opened. Switch 71 may then be closed to connect charging resistor 72 to Capacitor 11 which then charges reference capacitor 11 in a non-linear fashion according to the well-known RC charge relation as shown in equation [19]:

$$V_{CR} = V_{DD} \cdot \left(1 - e^{-\frac{T_c}{R_c \cdot C_R}}\right) \quad [19]$$

Where
$V_{CR}$=Voltage across reference capacitor at time $T_C$
$V_{DD}$=Power Supply Potential, Volts
$T_c$=Charge Time, Seconds
$R_c$=Charging Resistor Value, Ohms
$C_R$=Reference Capacitor Value, Farads Comparator 76 will then respond when the input connected to the capacitor exceeds the threshold specified to the other input of the comparator 76 which is determined as shown in equation [20].

$$V_{TH} = V_{DD} \cdot K_{DIV} \quad [20]$$

Where
$K_{DIV}$=Comparator Voltage Divider Ratio, Value of Resistor 74 divided by the sum of Resistor 74 and Resistor 73.
$V_{TH}$=Comparator Threshold Voltage when Comparator 76 Output Asserts to Ground.

Therefore, the time, $T_c$, when the voltage across the reference capacitor 11 triggers the comparator occurs when $V_{CR}=V_{TH}$. Therefore, the value of $T_c$ is found by setting equations [19] to equation [20] and solving for $T_c$. The expression for $T_c$, the capacitor charge time to the comparator voltage divider ratio, $K_{DIV}$, derived this way is given in equation [21]:

$$T_c = -C_R \cdot R_c \cdot \ln(1 - K_{DIV}) \quad [21]$$

and solving for $C_R$:

$$C_R = -\frac{T_c}{R_c \cdot \ln(1 - K_{DIV})} \quad [22]$$

And substituting the relation for determining the value of $C_R$ in equation [22] above into the equation for determining $L_x$ in equation [6]:

$$L_x = R_c \cdot \left(\frac{-\ln(1 - K_{DIV})}{(2\pi)^2}\right) \cdot \frac{(P_2^2 - P_1^2)}{T_c}. \quad [23]$$

Equation [23] shows that the value of the sensor's inductance can be developed from a circuit that depends only on design constants and the measurements of the two periods of oscillation, the first period with and the second without the reference capacitor added to the tank resonance circuit. The equation shows that the only design related factors are the measurement of the time, $T_c$, it takes to charge the reference capacitor to a given fraction of the charging power supply potential $K_{DIV}$, and the value of the charging resistor, $R_c$.

This invention therefore does not require that the value of any circuit capacitance be fixed to any degree of precision. The final result need be sensitive only to the stability of the reference resistor, $R_c$, and the time base which determines $P_1$, $P_2$, and $T_c$. The stability of these factors can be very good at a reasonable cost. A high quality precision resistor, although exhibiting very high stability is still, typically, much less stable with respect to environmental values such as temperature than a highly stable time base. Therefore a stable and repeatable measurement of position determined according to this invention is essentially as stable as the quality and stability of the charging resistor used to calibrate the reference capacitor. The result is that the inductance measurement performed by the preferred embodiment of this invention will be essentially as accurate as the resistor used to perform this calibration.

It should be noted that the reference capacitor so measured could be indicative of yet another physical parameter another part of the sensor apparatus might be subject to. For example, a capacitor with a known temperature coefficient might be employed whereas the value is measured and used to correct the inductive sensor measurement. Such capacitor would be indicative of the temperature in the vicinity of the circuit where it is mounted and could be used to compensate for the sensitivity of the inductive sensor measurements to the temperature of circuits in the immediate vicinity. Similarly, any sensitivity to pressure or even humidity may be compensated for by utilizing capacitive elements with known sensitivity to such environmental variations.

Figure 4:
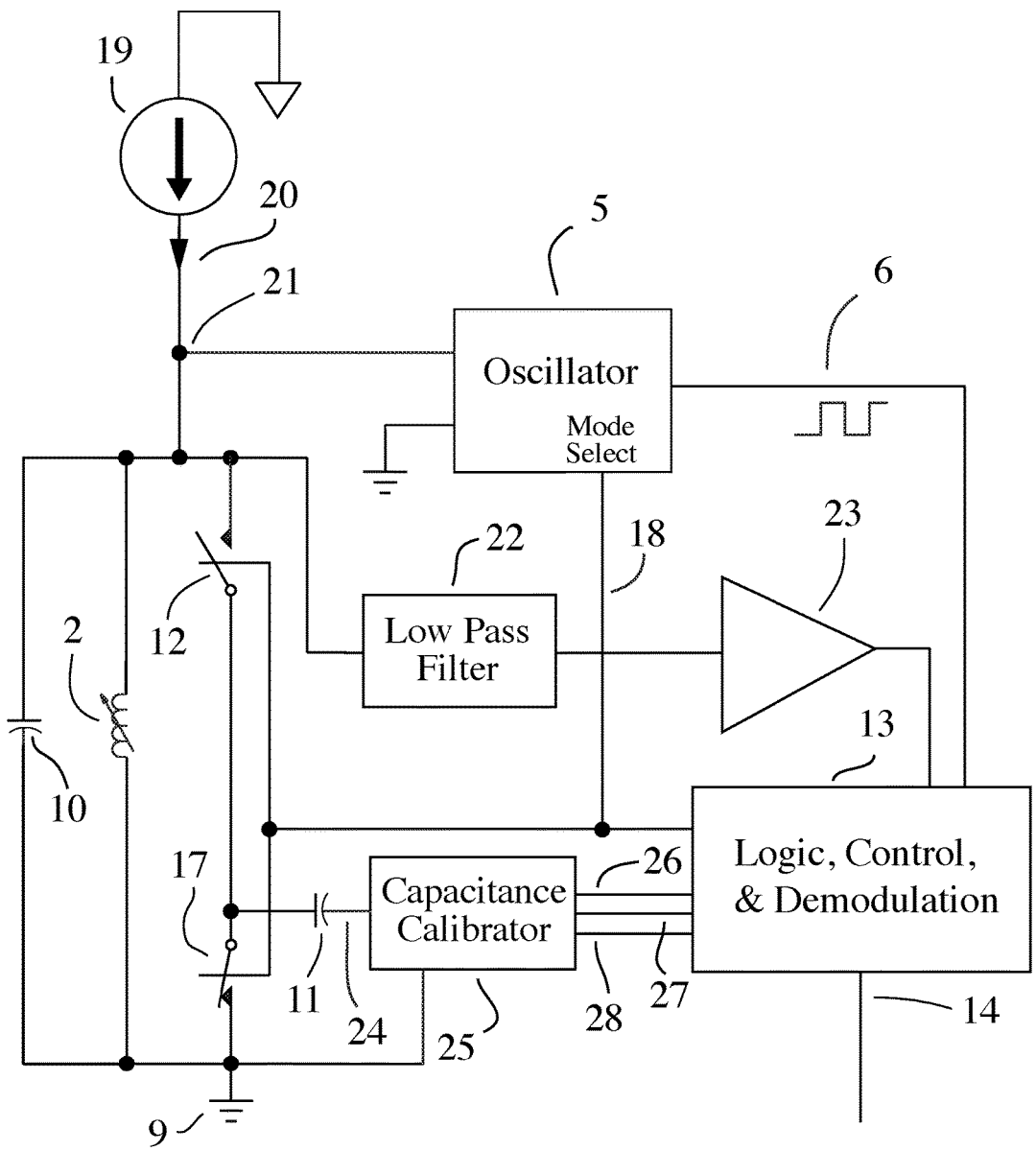
FIGS. 4 through 7 illustrate the preferred embodiment of this invention in a hierarchy of circuit drawings.
Figure 6:
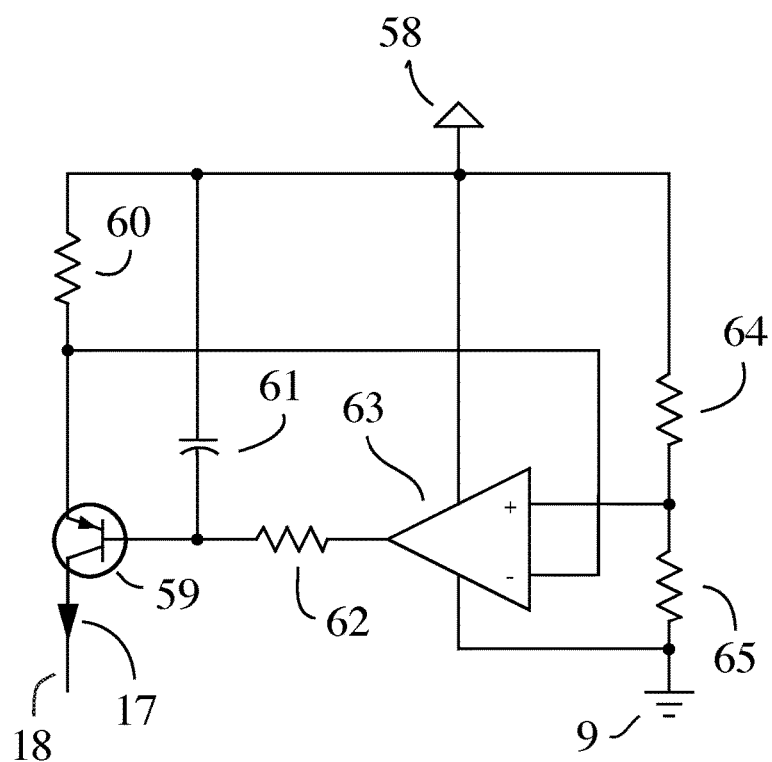
Figure 7:
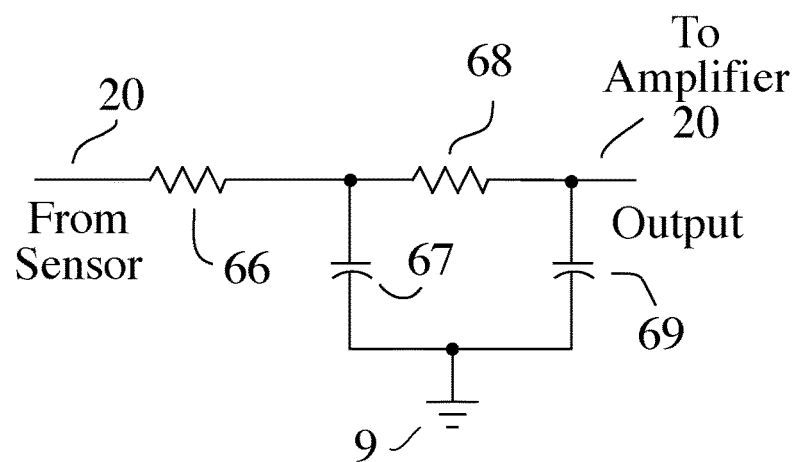

Given that practically all capacitance effects associated with an inductive sensor's resonance circuit can be compensated for according to this invention, including the temperature sensitivity of that capacitance, the largest remaining source of temperature sensitivity is due to the magnetic field physics that relate to the coupling of the moving target with respect to the sensor inductor. The degree of this coupling is therefore sensitive to temperature and so the position determined from such a non-contacting inductive sensor will invariably be temperature sensitive. To compensate for this effect the preferred embodiment of this invention incorporates this inventor's prior invention as disclosed in U.S. patent application Ser. No. 13/830,223 filed Mar. 14, 2013 to measure the temperature of the sensor using the very same inductive coil windings that constitute the position sensor. This same temperature measurement invention is implemented in the preferred embodiment of this invention in much the same way as described in this inventor's prior disclosure, but with an important distinction on account of the benefits of the invention disclosed herein: any affect of the capacitance introduced by the circuitry employed to extract a measurement of the temperature of the inductive sensor is substantially eliminated. Fundamental to this temperature measurement system is the provision of a substantial constant current with a high AC impedance at the frequency of the excitation. To the extent that the AC impedance of the DC current source is dominated by an equivalent capacitance, any sensitivity to any variation in that dominant part of that AC impedance will be avoided by use of this invention. It is this DC current provided by this DC current source circuit, multiplied by the temperature sensitive DC resistive impedance of the sensor which will produce a small DC potential in relation to the temperature sensitivity of the DC resistance of the sensor coil windings which is used to develop an accurate and repeatable measurement of the sensor's temperature. FIG. 6 shows the preferred embodiment of the constant current source for this purpose. Bipolar transistor 59, chosen for its ability to provide a very good constant current even at low base to collector DC bias voltages, is regulated by the action of op amp 63 so that the voltage across resistor 60 is made to match the voltage across resistor 64. Transistor 59 will then deliver 98% or more of that current to the sensor windings. A field effect transistor may also be used in the present invention in place of Transistor 59 to deliver, for all practical purposes, 100% of the metered current to the sensor. The value of resistive loss a field effect transistor adds to the circuit is typically much larger than a bipolar transistor for the same supply voltage, the field effect transistor requiring larger supply voltages to provide the same low loss circuit function. Field effect transistors or therefore a disadvantage as they will add to the losses in the sensor's resonant circuit, reduce the qualify factor, known as Q, of the resonant circuit, and therefore result in an increase in sensitivity of oscillation period to variations in the oscillator circuits. Another advantage accrues to the FIG. 6 circuit is that the voltage across resistor 64 will relate in proportion to the voltage potential applied to the power supply rail 58, the current will also relate in proportion to that voltage potential. Ultimately, the DC potential that will appear across the sensor's windings will therefore also be proportional to the power supply rail potential at 58, as will the filtered and amplified version of that potential developed by amplifier 23 in FIG. 4. Then, as the measurement of that amplified potential is then carried out most cost effectively with a ratio-metric analog to digital converter which would be incorporated in a modern micro-controller integrated circuit that may be used to implement Logic, Control & Demodulation circuit 13 in FIG. 4. Such analog to digital converters develop their readings in relation to the ratio of the applied voltage and possibly the same power supply rail potential at 58 or at least a fixed proportion of that power supply rail potential at 58. The result is a reading of the temperature which is insensitive to the power supply rail potential at 58, and without requiring a precision voltage source to develop accurate temperature measurements. Low pass filter 22 in FIG. 4, detailed in FIG. 7 is necessary to filter the high frequency oscillation used to demodulate the sensor inductance so that substantially only the DC component is passed on to amplifier 23 and so amplifier 23 can operate properly to accurately amplify only the DC potential component of the signal on the sensor inductor. A simple two pole low pass filter as shown in FIG. 7. is used to filter the high frequency component of the sensor voltage potential in this preferred embodiment.

Values related to the temperature of the sensor are then used to compensate for the temperature sensitivity of the sensor. Variations in temperature sensitivity as a function of the sensor's impedance or of the position of the sensor's target in the case of a position sensor are also accounted for in the compensation performed according to the preferred embodiment of this invention.

What is claimed is:

1. A sensor apparatus comprising:
   (a) at least one sensor element whose reactance, either capacitive or inductive, is a function of a physical parameter being sensed, and
   (b) an oscillator whereas said reactive sensor element is operated together with a complimentary reactance to that of the of said at least one sensor element, which complimentary reactance is either capacitive for an inductive sensor element or inductive for a capacitive sensor element, to form a signal related to the properties of the resonant circuit formed by the connection of said sensor element to said complimentary reactance and which determines the frequency and period of the signal produced by said oscillator,
   (c) at least one switch, operated to alternately connect and disconnect at least one reference reactance complementary to the reactance of said sensor element, either a capacitive element for an inductive sensor element or an inductive element for a capacitive sensor element, adding said reference reactance to said resonant circuit formed by the connection of the sensor element to said complimentary reactance,
   (d) a demodulation circuit to measure two period or two frequency related values of said oscillator signal, one with and one without the connection of at least one said reference reactance to said resonant circuit, and
   (e) an analog or digital computing circuit responsive to the said two frequency related values of said oscillator signal developed by said demodulation circuit to develop a signal related to the reactance of said sensor element part based substantially on the computation of the difference between the squares of the two said periods or squares of the reciprocal of said frequency related values developed by said demodulation circuit, said computing circuit developing at least an approximation thereof.

2. The sensor apparatus according to claim 1 whereas the difference between the squares of said periods or the reciprocal of the frequency related values obtained from the measurement of the periods or the frequency of said oscillator is equal or approximately equal to the period or the reciprocal frequency of the oscillator when said reference reactance is not connected to said resonant circuit.

3. The sensor apparatus according to claim 1 further comprising a temperature sensor subject to substantially the same temperature as said sensor element, providing signals useable for the correction of the temperature sensitivities of said sensor apparatus.

4. The sensor apparatus according to 3 further comprising a temperature measurement system utilizing a DC constant current source which current is supplied to the connections of said resonant circuit.

5. The sensor apparatus according to claim 1 whereas said sensor element is an inductor further comprising at least one electrically conductive shield element situated in the vicinity of significant magnetic fields generated by said inductive sensor element and configured in shape to avoid the inducement of any significant currents in such a shield element that would significantly alter the magnetic field developed by said inductive sensor element, and said conductive shield element electrically connected to the reference or ground potential utilized by said oscillator circuit.

6. The sensor apparatus according to claim 1 whereas said oscillator develops an oscillation period or frequency at the natural frequency of said resonant circuit including said sensor reactance whereas said oscillator includes an amplifier element exhibiting substantially zero phase lag between its input and output at or near the natural frequency of said resonant circuit regardless of the shift in the natural frequency of said resonant circuit due to the switching of said reference reactance.

7. The sensor apparatus according to claim 6 comprising a switch to alter the phase characteristics of a phase compensation circuit in synchronization with the switching of said reference reactance.

8. The sensor apparatus according to claim 1 further comprising an oscillator whose drive level applied to said resonant circuit is altered in synchronization with the switching of said reference reactance.

9. The sensor apparatus according to claim 1 further comprising a reactance measurement circuit configured to measure said reference reactance complementary to the reactance of said sensor element when said reference reactance is not connected by said switch whereas said measurement is used to further correct the sensor reactance related measurement developed according to claim 1 for variations in the value of said reference reactance complementary to the reactance of said sensor element.

10. The sensor apparatus according to claim 1 further comprising circuits configured to develop two analog voltage potentials proportional to the oscillation periods or frequencies of said oscillator with and without the connection of said reference reactance, whereas said analog voltage potentials are applied to an analog computer circuit to develop an indication related to the reactance of the sensor reactance.

11. The sensor apparatus according to claim 10 whereas said analog computer develops a signal related, at least approximately, to the square root of the difference between the squares of said two analog voltage potentials.

12. The sensor apparatus according to claim 10 whereas said analog computer circuit includes an analog computer that develops the weighted difference between the two said analog voltage potentials whereas the input from one input is weighted by a weighting factor as compared to the other, said weighting factor designed to result in an improvement in the sensitivity of the sensor reactance measurement to variation in the equivalent complementary reactance that forms the sensor's resonant circuit.

13. The sensor apparatus according to claim 12 whereas
    (a) the value of said reference reactance is chosen to be twice that of the expected value of the of the equivalent complementary reactance that forms the sensor's resonant circuit and
    (b) the value of said weighting factor is at least approximately the square root of 2.

14. The sensor apparatus according to claim 1 further comprising counter circuits configured to measure period or frequency related values of said oscillator with and without the connection of said reference reactance.

15. The sensor apparatus according to claim 14 whereas said demodulation circuit is comprised of a digital computing circuit that develops a digital signal related to, or at least approximately, the square root of the difference of the squares of the two said digital signals.

16. The sensor apparatus according to claim 15 whereas
    (a) the difference between the squares of said periods or the reciprocal of the frequency related values obtained from the measurement of the periods or the frequency of said oscillator is equal or nearly equal to the period or the reciprocal frequency of the oscillator when said reference capacitor is not connected to said resonant circuit, and
    whereas,
    (b) said computing circuit determines a value that results from the difference between the multiplication of the period or reciprocal frequency measured when said reference reactance is connected by a factor that is or approximately the square root of 2 larger than a factor used to multiply the period or reciprocal frequency measured when said reference reactance is not connected, and the period related or reciprocal frequency related value determined when said reference reactance is not connected.

17. The sensor apparatus according to claim 1 whereas said computing circuit is comprised of a digital computing circuit that develops a digital signal related to, or at least an approximation of, the square root of the difference of the squares of the two said digital signals.

18. The sensor apparatus according to claim 1 whereas said switch is comprised of a switching element or a plurality thereof configured and operated in such a way so that the capacitance said switch itself adds to the parallel capacitance in said sensor resonant circuit is substantially independent of the switching state of said switch.

19. The sensor apparatus according to claim 18 whereas said switch is comprised of a pair of single pole single throw electronic switches in series or, equivalently, a single pole double throw electronic switch configured and operated so that the series combination of the two switches or the connections between the switch and the resonant circuit always results in substantially the same added capacitance due to the connection of said switch to the parallel capacitance in said sensor resonant circuit without regard to the state of said switch.

20. The sensor apparatus according to claim 1 whereas said computing circuit is configured to provide a signal related to the equivalent extraneous complementary reactance said sensor apparatus is in resonance with.

21. The sensor apparatus according to claim 20 whereas the measurement of said equivalent extraneous complementary reactance that is in resonance with said sensor reactance provides a measure of environmental variations which are used to correct for the effect of such environmental variations on the sensor signal.

22. The sensor apparatus according to claim 21 whereas said measure of environmental variations at least includes temperature, or pressure, or a combination thereof.

23. The sensor apparatus according to claim 1 whereas
    (a) said complementary reference reactance is measured in connection with a resistor when it is not connected across said resonant circuit, and
    (b) said reference reactance measurement is used to correct the sensor reactance measurement for the value of said reference reactance.

24. The sensor apparatus according to claim 23 whereas said reference reactance provides a measure of environmental variations which are used to correct for the effect of such environmental variations on the sensor signal in addition to correcting for the effect of the variation in the value of said reference reactance on the sensor signal measurement.

25. The sensor apparatus according to claim 23 whereas the value of said complementary reference reactance so determined is indicative of another physical property said subject reference reactance may be subject to.

26. A sensor apparatus comprising:
    (a) at least one sensor element whose reactance, either capacitive or inductive, is a function of a physical parameter being sensed, and
    (b) an oscillator whereas said reactive sensor part is operated together with a complimentary reactance to that of the of said at least one sensor element, which complimentary reactance is, either capacitive for an inductive sensor element or inductive for a capacitive sensor element, to form a signal related to the properties of the resonant circuit formed by the connection said sensor element to said complimentary reactance and which determines the frequency and period of the signal produced by said oscillator,
    (c) at least one switch, operated to alternately connect and disconnect at least one reference reactance complementary to the reactance of said sensor element, either a capacitive element for an inductive sensor element or an inductive element for a capacitive sensor element, adding said reference reactance to said resonant circuit formed by the connection of the sensor element to said complimentary reactance, (d) an electronically variable reactance part that controls the amount of said complementary reactance to the said sensor element added to said resonant circuit as a function of an electronic control signal, (e) a demodulation circuit to measure two period or two frequency related values of said oscillator signal, one with and one without the connection of said at least one said reference reactance to said resonant circuit, and (f) and a demodulation circuit to measure period or frequency related values of said oscillator with and without the connection of said at least one reference reactance to the reactive sensor element, and configured to control said electronically variable reactance to maintain a substantially constant total equivalent reactance complementary to said sensor reactance in connection with said sensor element to form a resonant circuit free from the effects of any variation in all other equivalent reactance complementary to said sensor, (g) an analog or digital computing circuit responsive to the said two values developed by said demodulation circuit, said analog or digital computing circuit computing the value of an electronic control signal applied to said reactive sensor element to realize a fixed ratio between the total reactance complementary to the reactance of the said sensor element, and the reactance of said reference reactance connected to said resonant circuit by said switch for an inductive sensor element this computing circuit would determine, through its connection to said reactive sensor element, the total capacitive reactance forming said resonant circuit or, for a capacitive sensor element, said computing circuit would determine, through its connection to said electronically variable reactance circuit part, the total inductive reactance in connection with said sensor element that forms said resonant circuit to realize a total reactance which is a fixed ratio to said reference reactance to form a resonant circuit free from the effects of any variation in the reactance of all other equivalent reactances complementary to said sensor reactance.

27. A sensor apparatus according to claim 26 whereas said sensor element is controlled in proportion to a signal related to the ratio of the period values of said oscillator with and without the connection of said reference reactance complementary to said sensor reactance.

28. A sensor apparatus according to claim 26 whereas said sensor element circuit is controlled by a signal related to the weighted sum difference of the period values of said oscillator with and without the connection of said reference reactance complementary to said sensor reactance.

* * * * *